United States Patent [19]

Satoh

[11] Patent Number: 5,734,864
[45] Date of Patent: *Mar. 31, 1998

[54] INTERACTIVE LOGIC SIMULATION SYSTEM

[75] Inventor: Akiko Satoh, Kawasaki, Japan

[73] Assignee: Fujitsu Limited, Kawasaki, Japan

[ * ] Notice: The term of this patent shall not extend beyond the expiration date of Pat. No. 5,563,993.

[21] Appl. No.: 459,357

[22] Filed: Jun. 2, 1995

[30] Foreign Application Priority Data

Jun. 3, 1994 [JP] Japan ................................. 6-122588

[51] Int. Cl.$^6$ .................................................. G06F 9/455
[52] U.S. Cl. .................. 395/500; 364/232.3; 364/DIG. 1
[58] Field of Search ........................... 395/500; 364/578, 364/488–491

[56] References Cited

U.S. PATENT DOCUMENTS

| | | | |
|---|---|---|---|
| 5,220,512 | 6/1993 | Watkins et al. | 364/489 |
| 5,247,468 | 9/1993 | Henrichs et al. | 364/578 |
| 5,381,524 | 1/1995 | Lewis et al. | 395/161 |
| 5,544,067 | 8/1996 | Rostoker et al. | 364/489 |

*Primary Examiner*—Kevin J. Teska
*Assistant Examiner*—Ayni Mohamed
*Attorney, Agent, or Firm*—Staas & Halsey

[57] ABSTRACT

An interactive logic simulation system includes a setting unit for setting at least one display format for logic simulation result information in the form of a window defined by an arbitrary display range by interacting with a user through a display screen; a first management table for managing the display mode of a free-format display format set by the setting unit; a second management table for managing the display mode of a stream display format as a time series display format of the logic simulation result information; a third management table for managing time series data of signal values for each signal terminal constituting the logic simulation result information; and a result display control unit for specifying the logic simulation result information by using management data from the first, second and third management tables, and for displaying the logic simulation result information so specified on the display screen. The system simultaneously displays the logic simulation result information in the free-format display format at a designated time and the logic simulation result information in the stream display format at the designated signal terminal, in the window set on the display screen. Such a construction makes it possible for a user to efficiently conduct execution and analysis of simulation without particularly considering the troublesome procedures and the operations of the logic simulation. When the simulation procedure of the next stage is considered, a high operation factor can be provided by reducing the interruption to the consideration.

17 Claims, 20 Drawing Sheets

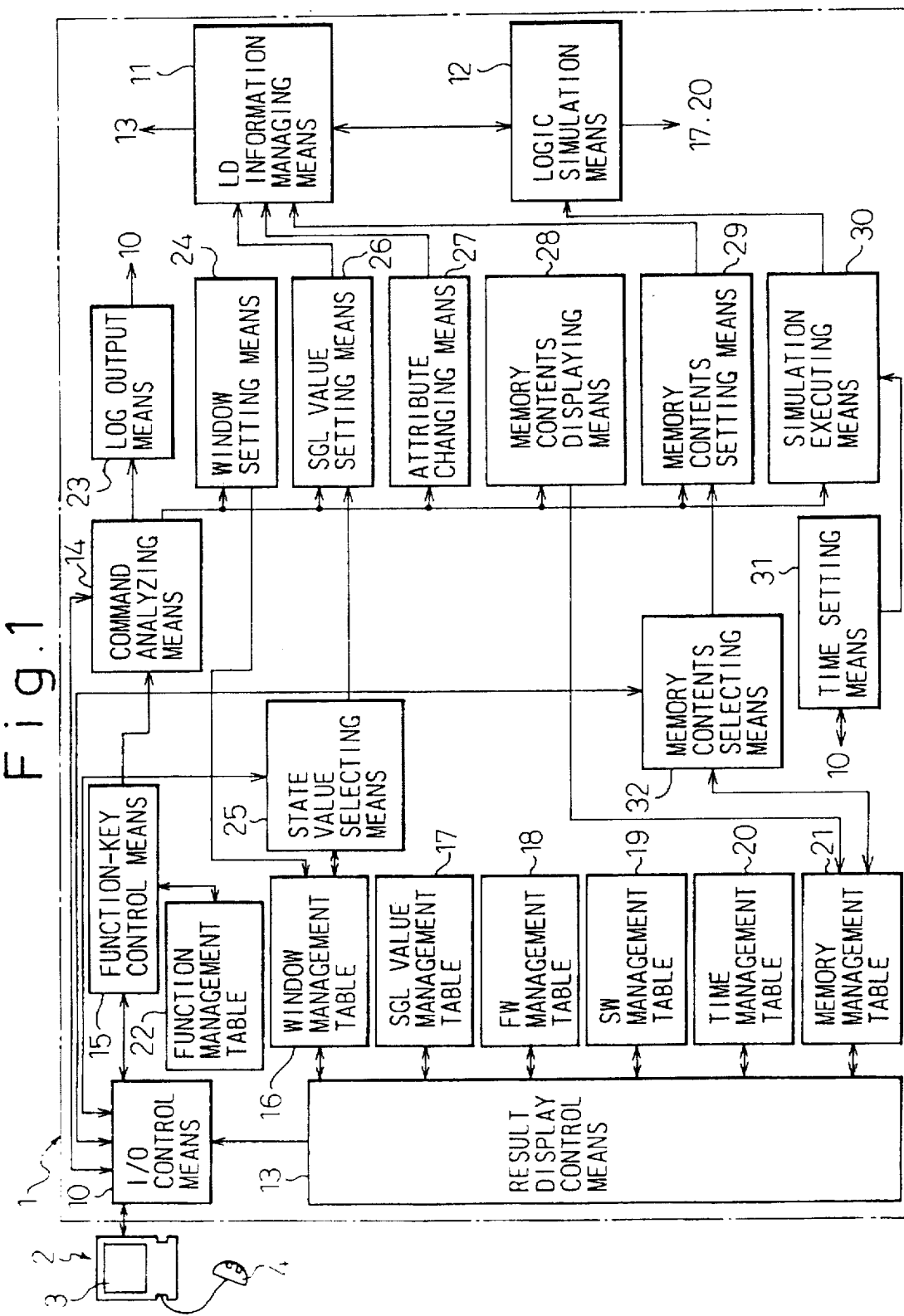

Fig.2a

| CLASSIFICATION OF WINDOW |
|---|
| LOCATION OF DISPLAY |
| LOCATION OF MGT TABLE |
| CONTENTS OF DISPLAY |

| X | Y | SGL TERMINAL |
|---|---|---|
| ⋮ | ⋮ | ⋮ |

DATA1=001
DATA2=010

RESULT=011

Fig.2c

| SGL TERMINAL |
|---|
| ⋮ |

| DISPLAY TIME |
|---|
| PRESENT TIME |

TIME →

| SGL TERMINAL | VALUE | ---- | -------- |
|---|---|---|---|
| ⋮ | ⋮ | ⋮ | ⋮ |

17

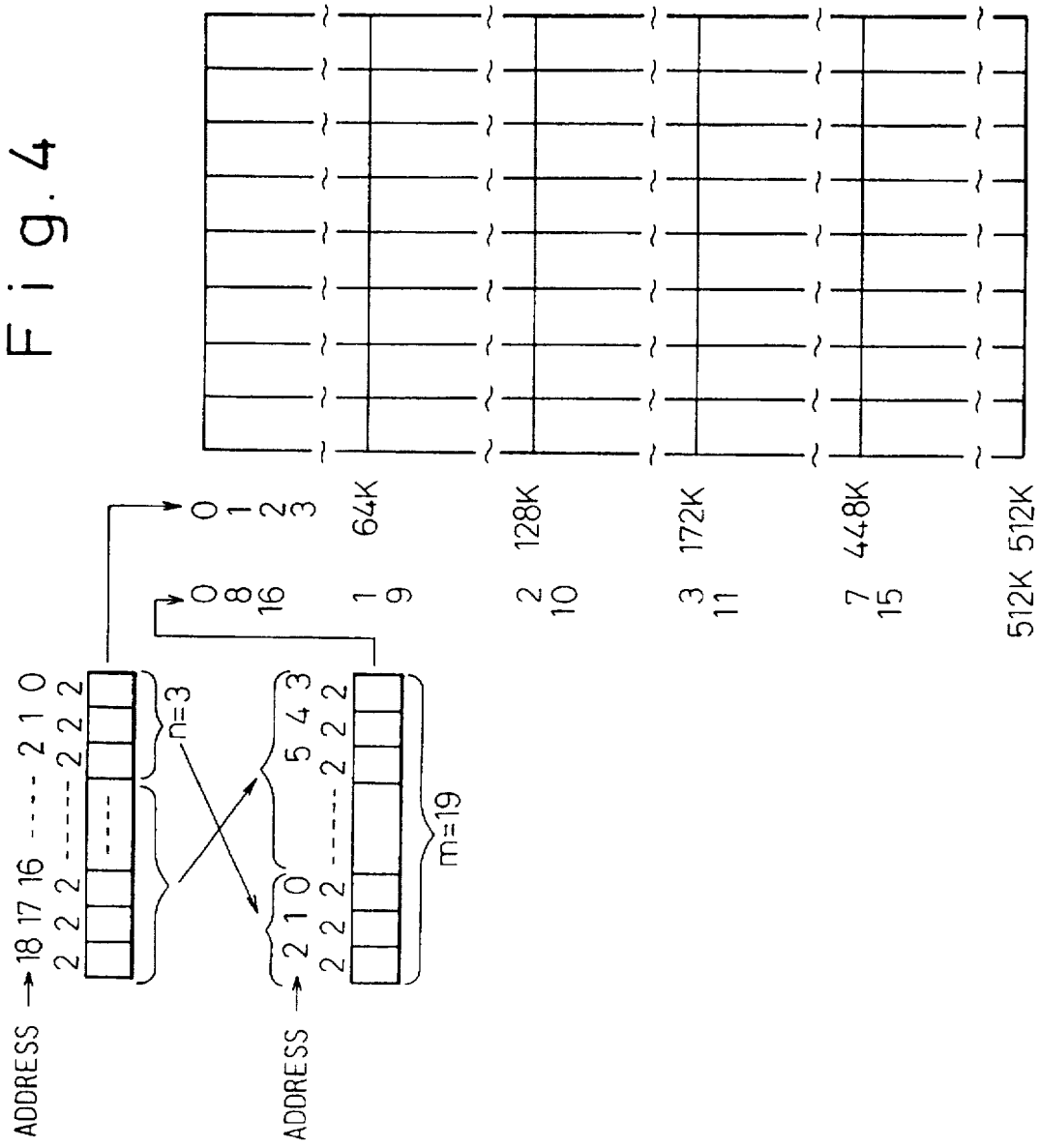

| NO. | COMMAND CHARACTER STRING |
|---|---|
| ① | SIML  t1 ; |
| ② | D SETS  '/SIG1'='0' ; |
|  |  |

Fig. 11

```
MEMORY INSPECTOR
NAME  MEMORY01 *1              WORD 16K *2   BIT 72 *3   INTL 1 *4
BASE ADR  0 *5    DISPLACE 0 *6    MODE HEX *7 V PAGE*8H PAGE*9COL 0 *10
     *11        *12
FORMAT    HHHHHHHH HHHHHHHH BBBB *13
*14   0   FFFFFFFF 00000000 0000    *15
      1   10000000 00000000 0000
      2   FFFFFFFF 00000000 0000
      3   10000000 00000000 0000
      4   FFFFFFFF 00000000 0000
      5   10000000 00000000 0000
      6   FFFFFFFF 00000000 0000
      7   10000000 00000000 0000
      8   FFFFFFFF 00000000 0000
      9   10000000 00000000 0000
      A   FFFFFFFF 00000000 0000
      B   10000000 00000000 0000
      C   FFFFFFFF 00000000 0000
      D   10000000 00000000 0000
      E   FFFFFFFF 00000000 0000
      F   10000000 00000000 0000
COMMAND ⇨  *16
     PF3 KEY : CANCEL THIS MENU.    ENTER KEY : EXEC.
```

Fig. 13

| MEMORY INSPECTOR | | | | | | |
|---|---|---|---|---|---|---|
| NAME MEMORY01 *1 | | WORD 16K *2 | BIT 72 *3 | | INTL 1 *4 | |
| BASE ADR 0 *5 | DISPLACE 0 *6 | MODE HEX *7 | V PAGE*8H | PAGE*9COL 0 *10 | | |
| *11 *12 | | | | | | |
| FORMAT | HHHHHHHH HHHHHHHH BBBB *13 | | | | | |
| *14 0 | 00000000 00000000 0000 *15 | | | | | |
| 1 | 10000000 00000000 0000 | | | | | |
| 2 | FFFFFFFF 00000000 0000 | | | | | |
| 3 | 10000000 00000000 0000 | | | | | |
| 4 | FFFFFFFF 00000000 0000 | | | | | |
| 5 | 10000000 00000000 0000 | | | | | |
| 6 | FFFFFFFF 00000000 0000 | | | | | |
| 7 | 10000000 00000000 0000 | | | | | |
| 8 | FFFFFFFF 00000000 0000 | | | | | |
| 9 | 10000000 00000000 0000 | | | | | |
| A | FFFFFFFF 00000000 0000 | | | | | |
| B | 10000000 00000000 0000 | | | | | |
| C | FFFFFFFF 00000000 0000 | | | | | |
| D | 10000000 00000000 0000 | | | | | |
| E | FFFFFFFF 00000000 0000 | | | | | |
| F | 10000000 00000000 0000 | | | | | |

COMMAND ⇨ *16
PF3 KEY : CANCEL THIS MENU.  ENTER KEY : EXEC.

INTERACTIVE LOGIC SIMULATION SYSTEM

BACKGROUND OF THE INVENTION

1. Field of the Invention

This invention relates to a technology for simulating a logic circuit. More particularly, the present invention relates to an interactive logic simulation system which simulates logic, interacts with a user through a display screen and displays the result of the simulation on a display screen.

The integration density of logic circuits in computer systems, etc., has become very high in recent years and with this trend, the time required to simulate the operation of the logic circuits and to analyze their operation becomes extremely long. In order to conduct logic simulation in a hierarchical manner and to verify each unit in a process for designing a large scale circuit hierarchically, it is important that the simulation as low in the hierarchy, at a small scale, can be made easily and comprehensively as simulation of circuits high in the hierarchy, at a large scale.

2. Description of the Related Art

Interactive logic simulation systems according to the prior art employ a "free-format display format" system which displays logic simulation result information at a designated time in a display format which a user can freely define, or a "stream display format" system which displays logic simulation result information at signal terminals designated in accordance with a display format defined inherently in the system.

The free-format display format provides the advantage that a large number of signal values at signal terminals, as the logic simulation result information, can be displayed on one screen, but involves the problem that when any error in a logic circuit is discovered, a long time is required to determine the cause because the system cannot trace the flow of the signal values with time. On the other hand, the stream display format displays the time series data of the signal values of the signal terminals and provides the advantage that when an error in the logic circuit is discovered, analysis of the cause is easy. However, this system is not free from the drawback that, because the time series data are displayed, the number of the signal terminals that can be displayed on one screen becomes small and consequently, separate screens must be used so frequently that the simulation operation requires a long time. As described above, both of the systems have their merits and demerits, respectively.

In the logic simulation methods according to the prior art, the procedure of the logic simulation (such as circuit operation patterns) is described in advance in a command language, the simulation is executed after the command language is translated, and the execution result, that is, the logic simulation result information, is analyzed so as to confirm the operation of the logic circuit.

A relatively large number of design errors occur at the initial stage of the logic circuit design. Therefore, a system wherein a designer of the logic circuit considers the next simulation operation while viewing little by little the operating state of the circuit through an interaction with the display screen is believed to be more suitable rather than a system in which various circuit operation patterns are described in advance.

As described above, the prior art technology executes logic simulation on the basis of the steps of describing the simulation procedure by the command language execution of the simulation, analysis of the results and confirmation of the operation.

Accordingly, there remains the problem that a great deal of time and effort are necessary from the start of the simulation, after the design of the logic circuit, to the confirmation of the circuit operation.

The prior art technology does not necessarily allow the designer of the logic circuit to describe the next simulation procedure after the analysis of the results and the confirmation of the operations.

SUMMARY OF THE INVENTION

It is an object of the present invention to provide an interactive logic simulation system which enables a user to efficiently execute simulation and to analyze the simulation result without the necessity of troublesome procedures and operations relating to the simulation, and which reduces interruption when the simulation procedure for the next stage is considered.

According to the present invention, there is provided an interactive logic simulation system employing a construction wherein logic simulation is effected by interacting with a user using a display screen and the result of the simulation is displayed on the display screen, the system comprising setting means for setting at least one display format of the logic simulation result information in the form of a window defined by an arbitrary display range through the interaction with the user using the display screen; a first management table for managing the display form of a free-format display format set by the setting means; a second management table for managing the display form of a stream display format to serve as a time series display format of the logic simulation result information; a third management table for managing time series data of a signal value for each of signal terminals for forming the logic simulation result information; and result display control means for specifying the logic simulation result information by using the management data of the first, second and third management tables, and executing treatment in such a manner as to display the logic simulation result information so specified on the display screen; wherein the logic simulation result information in the free-format display format at a designated time and the logic simulation result information in the stream display format at a designated signal terminal are simultaneously displayed in a window set on the display screen.

According to a preferred embodiment of the present invention, the system described above further comprises a memory management table for managing data defining a logic address space for specifying a plurality of memory cells inside the circuit as the logic simulation object; and wherein the memory content is displayed on the display screen by a memory virtual space image defined by the logic address space by looking up the memory management table.

The present invention employs a basic construction wherein the logic simulation result information in a free-format display format and which also makes it possible to display the signal values of a large number of signal terminals and the logic simulation result information in the stream display format, and which also makes it possible to grasp the flow of the signal values of the signal terminals with time, are simultaneously displayed in the form of a multi-window on the same display screen, and wherein the memory content is displayed as the memory virtual space image on the display screen. Therefore, the present invention eliminates an input command, etc., by the selection of a menu, sets a state value by direct write on the free-format display, executes simulation by directly designating the time portion on the stream display and rewrites the memory content by direct write on the memory content display.

Accordingly, the user can efficiently execute the logic simulation and can analyze the simulation result without considering a troublesome procedure or and operation of the logic operation. When the simulation procedure of the next stage is considered, an interruption to the consideration is reduced, and the execution of the simulation can be made efficiently.

BRIEF DESCRIPTION OF THE DRAWINGS

The above and other objects and features of the present invention will be described hereinafter in detail by way of preferred embodiments with reference to the accompanying drawings, in which:

FIG. 1 is a block diagram showing the construction of an interactive logic simulation system according to one embodiment of the present invention;

FIGS. 2a to 2f are explanatory views of a window management table and various tables associated with the former shown in FIG. 1;

FIG. 4 is an explanatory view of an interleaving of a memory;

FIG. 11 is a table showing an example of the content display of a memory virtual space image in the system shown in FIG. 1;

FIG. 13 is a table showing another example of content re-write of the memory;

DESCRIPTION OF THE PREFERRED EMBODIMENTS

Figure 3A:
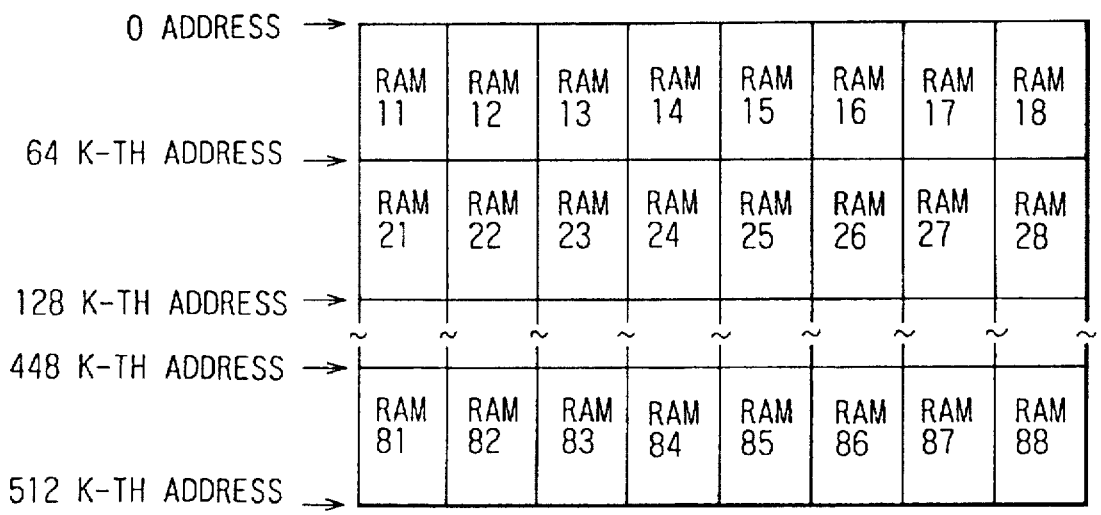
FIGS. 3a and 3b are explanatory views of a memory management table shown in FIG. 1.

FIG. 1 shows the construction of an interactive logic simulation system according to one embodiment of the present invention.

In the drawing, reference numeral 1 denotes the logic simulation system according to the present invention, and reference numeral 2 denotes a terminal provided to the logic simulation system 1. The terminal 2 includes a display 3 for displaying logic simulation result information, etc., and an input device 4 such as a keyboard or a mouse operated by a user or an operator.

The logic simulation system 1 includes an input/output (I/O) control means 10, a logic circuit data (LD) information managing means 11, a logic simulation means 12, result display control means 13, a command analyzing means 14, a function-key control means 15, a window management table 16, a signal value management table 17, a free-format window (FW) management table 18, a stream window (SW) management table 19, a time management table 20, a memory management table 21, a function management table 22, a log output means 23, a window setting means 24, a state value selecting means 25, a signal value setting means 26, an attribute changing means 27, a memory content displaying means 28, a memory content setting means 29, a simulation executing means 30, a time setting means 31 and a memory content selecting means 32. Hereinafter, each of these constituent elements will be explained.

The input/output (I/O) control means 10 executes an interface treatment between the terminal 2 and the system. The logic circuit data (LD) information management means 11 manages the logic circuit data information as the object of logic simulation. However, because the logic circuit data information is practically described by signal terminal numbers, the LD information managing means 11 manages the correspondence relation between the signal terminal number and the signal terminal name of user definition. The logic simulation means 12 executes the logic simulation treatment of the logic circuit managed by the LD information managing means 11, registers the logic simulation result information to the signal value management table 17, and registers the simulation and the time to the time management table 20.

The result display control means 13 executes control so that the logic simulation result information can be displayed on the display 3 of the terminal 2, by using the management data of each of the window management table 16, the signal value management table 17, the free-format window management table 18, the stream window management table 19 and the time management table 20.

The command analyzing means 14 analyzes the command given thereto by the user, creates the command management table, and transfers the control to the command designated. The function key control means 15 interacts with the user and transfers a command allocated to a function key designated by the user through the input device 4 of the terminal 2 to the command analyzing means 14.

The window management table 16 manages the display modes of one or a plurality of windows to be displayed on the display 3 of the terminal 2. The signal value management table 17 manages the time series data of the signal value for each signal terminal constituting the logic simulation result information. The free-format window (FW) management table 18 manages the display mode of the free-format display system of user definition. The stream window (SW) management table 19 manages the display mode of the stream display form of a system definition constituting the time series display form of the logic simulation result information. The time management table 20 manages the logic simulation time to be displayed as well as the present display time. The memory management table 21 manages the definition data of the later-appearing logic address space. The function key management table 22 manages the command data set to the function key provided to the input device 4 of the terminal 2.

The log output means 23 outputs the commands free from errors as a "log" on the basis of the analysis result of the command analyzing means 14.

The window setting means 24 executes the process for setting one or a plurality of windows (free-format window and stream window) to be displayed on the display 3 of the terminal on the basis of the analysis result of the command analyzing means 14 through an interaction with the user. More concretely, when the user desires to display two kinds of free-format windows, for example, the window setting means 24 windows two free-format windows in addition to the display of the stream window, and allocates the free-format display formats desired by the user to these two windows through an interaction with the user. Such a process is similarly done when two or more kinds of free-format windows are displayed. Further, the window setting means 24 has the function of changing the size and the disposition of the windows for the free-format windows through the interaction with the user.

The state value selecting means 25 selects the state value in the free-format display format displayed on the display 3 of the terminal 2 through an interaction with the user. The signal value setting means 26 sets a value to the signal terminal obtained by the result of analysis when a command is judged as a signal value setting command on the basis of the analysis result of the command analyzing means 14. The attribute changing means 27 changes the attribute of the signal terminal obtained from the analysis result of the command analyzing means 14 when the command is judged to be a attribute changing command, on the basis of the analysis result of the command analyzing means 14, and inhibits the evaluation of the corresponding device or circuit.

The memory content displaying means 28 looks up the memory management table 21 when the command is judged to be the memory content display command, on the basis of the analysis result of the command analyzing means 14, and displays the content of the corresponding memory on the display 3 of the terminal 2. When the command is judged to be a memory content setting command on the basis of the analysis result of the command analyzing means 14, the memory content setting means 29 rewrites the memory content in the simulation object circuit.

When the command is judged as a simulation execution command on the basis of the analysis result of the command analyzing means 14, the simulation executing means 30 transfers control to the logic simulation means 12 and executes logic simulation at the designated time. The time setting means 31 sets an arbitrary simulation time in the stream display format displayed on the display 3 of the terminal 2 through the interaction with the user, transfers the control to the logic simulation means 12 through the simulation executing means 30, and executes the logic simulation for the simulation time so set. By the way, when the set simulation time is a time before the present time, processing is executed in such a manner that the simulation result at the past set time is displayed in the free-format display format.

The memory content selecting means 32 selects the memory content designated by the user from among the memory contents displayed on the display 3 of the terminal 2, through an interaction with the user, and transfers the selected memory content to the memory content setting means 29. When the selected memory content value is different from the original display value, the memory content setting means 29 rewrites the selected memory content.

Hereinafter, various management tables used to display the logic simulation result information will be explained, in detail, with reference to FIGS. 2a to 5.

FIGS. 2a to 2f are diagrams for explaining a window management table and various other tables associated with it.

The window management table 16 shown in FIG. 2a is used for managing the attribute information of the window displayed on the display 3 of the terminal 2. More concretely, the window management table 16 includes a window classification entry for classifying and managing whether the window set by the window setting means 24 is the free-format window or the stream window, a display location entry for managing the location of display of the window set, a management table location entry for managing the expansion location of the display mode data of the window set or a display content entry for managing the expansion location of the display content data of the free-format window specified previously.

The free-format window (FW) management table 18 shown in FIG. 2b manages the display mode data of the free-format display format of user definition as described already. More definitely, this management table 18 manages the display mode data by stipulating at which display location the signal value of a signal terminal should be displayed. The window management table 16 described above manages the expansion location of the free-format window management table 18, which manages the set free-format display mode data, when the classification of the free-format window is managed by the window classification entry.

The signal value management table 17 shown in FIG. 2d manages the logic simulation result information as described already. More definitely, it manages the time series data of the signal value for each signal terminal. The time management table 20 shown in FIG. 2e manages the display time of the logic simulation as the object and the present display time. Further, FIG. 2f shows the display content table, and re-utilizes the display content data of the free-format window specified previously. The window management table 16 manages the expansion location of this display content table in the display content entry.

As described above, the window management table 16 manages the display mode of one or a plurality of windows to be displayed on the display 3 of the terminal 2. Display in each window set is effected by looking up the free-format window (FW) management table 18 and the signal value management table 17 in the case of the free-format display format and by looking up the stream window (SW) management table 19 and the signal value management table 17 in the case of the stream display format. When the simulation time passes by or when the time ahead of the present time is designated, the time management table 20 makes control in such a manner as to synchronize the display simulation time of all the windows.

When an arbitrary value displayed in the window of the free-format display format is designated, the signal terminal corresponding to the designated state value can be known by looking up the free-format window (FW) management table 18. Accordingly, when the state value on the window is rewritten, the free-format display format window is rewritten by setting this state value to the circuit information of the designated signal terminal (that is, the circuit information managed by the logic circuit data information managing means 11), and the signal value can be so set.

Figure 3B:
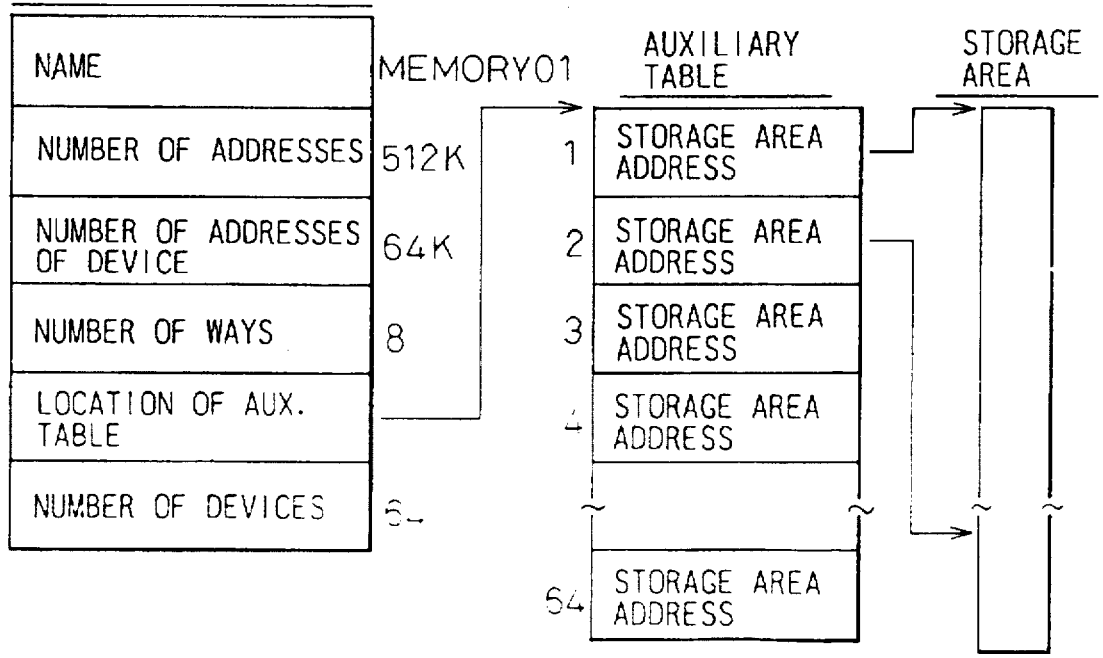

FIGS. 3a and 3b are explanatory views useful for explaining the memory management table.

FIG. 3a shows a memory virtual space image defining the address space specifying a plurality of memory cells (in RAM) inside the logic circuit as the logic simulation, and FIG. 3b shows the construction of the memory management table 21 which manages this memory virtual space image.

This memory virtual space image is defined by an example of the following memory definition.

Memory Definition Example

MEMORY MEMORY01 (('/RAM_SIG11', '/RAM_SIG12', ...,'/RAM_SIG18'), ('/RAM_SIG21', '/RAM_SIG22', ...,'/RAM_SIG28'), ..., ('/RAM_SIG81', '/RAM_SIG82', ...,'/RAM_SIG88')) SIZE (512K, 8);

In this memory definition example, '/RAM_SIG11', 8/RAM_SIG12', and so forth, represent the signal names for the model of each memory cell (RAM), and the example shown in the drawing defines a 512K address space having an 8-bit width by using 8×8 RAMs of 64K addresses.

FIG. 4 is an explanatory view useful for explaining interleaving of memory.

When the addresses are discontinuous due to interleave, etc., the number of ways is defined as shown in the following interleave designation definition example.

Interleave Designation Definition Example

MEMORY MEMORY01 (('/RAM_SIG11', '/RAM_SIG12', ...,'/RAM_SIG18'), ('/RAM_SIG21', '/RAM_SIG22', ...,'/RAM_SIG28'), ..., ('/RAM_SIG81', '/RAM81', '/RAM_SIG82', ...,'/RAM_SIG88')) SIZE (512K, 8) INTERLEAVE (8):

When the number of ways is 8 as in this example, the lower three bits (0 to 2) among the 19 bits (0 to 18) are moved to the higher order so as to calculate the address. By the way, in FIG. 4, m=19 is obtained by the calculation of log(number of addresses)=log(512K), and n=3 is obtained by the calculation of log(number of ways)=log(8).

The number of ways, the number of addresses, the signal name, etc., defined in this manner are managed by the memory declaration management table shown in FIG. 3b. The memory virtual space described above can be created by making access to the memory area through the auxiliary table expanded by the auxiliary table location entry inside the memory declaration management table, and by so doing, the content display inside the memory can be made.

Even when the addresses are discontinuous in accordance with a certain conversion rule, the memory virtual space can be created by effecting the address calculation of the interleave from the number of ways of the memory declaration management table.

Further, when write is made to the memory, the memory content can be rewritten by making access to the memory area in the same way as in the display of the memory content.

Figures 5, 6:
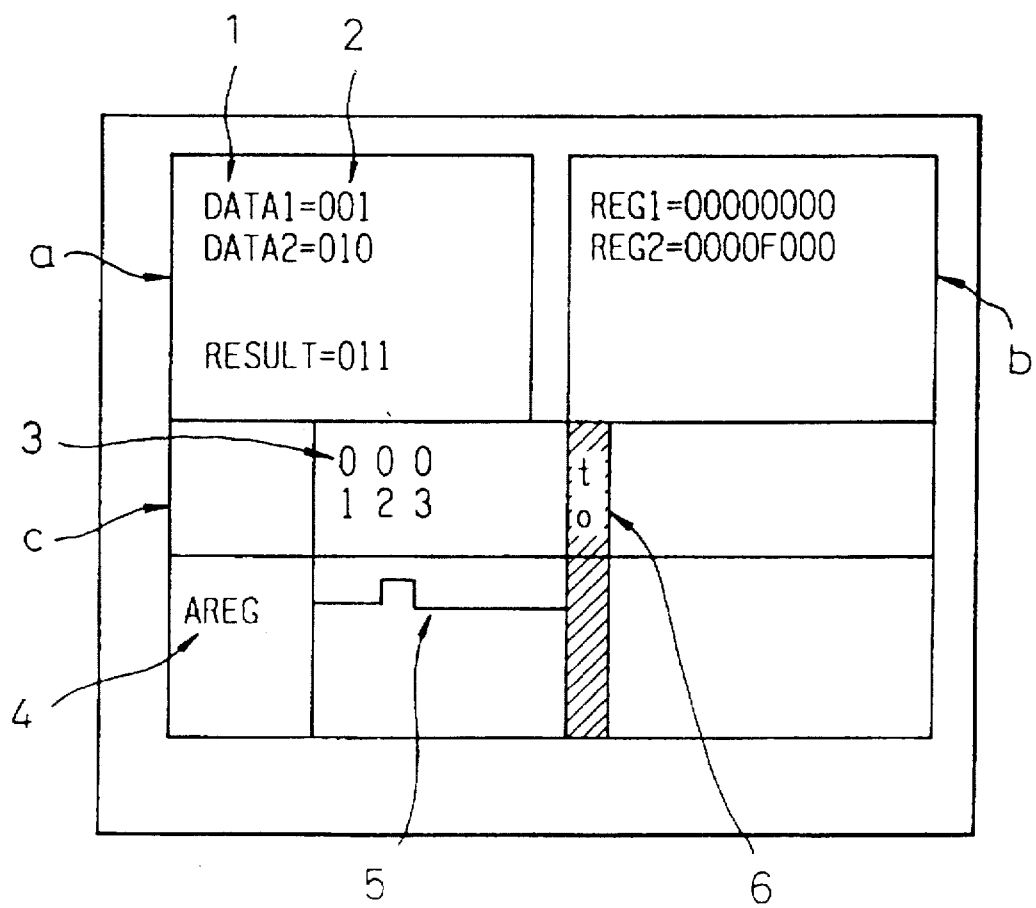
FIG. 5 is an explanatory view of a function management table shown in FIG. 1.
FIG. 6 is a table showing the first example of a display processing of logic simulation result information in the system shown in FIG. 1.

FIG. 5 is an explanatory view useful for explaining the function management table 22.

When the function key is operated from the input device 4 of the terminal 2 through the interaction with the user, the command string to be executed can be obtained by looking up the function management table shown in the drawing.

In FIG. 5, ① when the table starts with the command such as the command character string (command for executing simulation in the example shown; SIML), this command is handed over to the command analyzing means 14 and instantaneous execution of the command is processed. ② when "D" exists at the start of the command character string, the command character string is displayed in the command input area (region ⑦) in later-appearing FIG. 7).

As described already, the interactive logic simulation system according to the present invention employs the basic construction wherein the logic simulation result information expressed by the free-format display format and the logic simulation result information expressed by the stream display format are simultaneously displayed on the same display screen by using the multi-window. Though the display form of the stream display format is prepared in advance on the system side, the display form of the free-format display format is freely defined by the user.

The setting processing of the display form of this free-format display system is controlled by the window management table 16 (free-format window management table 18) and the window setting means 24. In other words, the user designates the display form by stipulating at which display position the signal value of a signal terminal should be displayed in the screen image, and this signal value is converted to the internal data format of the logic simulation system 1 so that one or a plurality of free-format display formats (for example, windows a and b shown in FIGS. 6 to 10) can be set.

Here, each of the stream display format and the free-format display format permits definition of a plurality of signal terminals as one group. For example, four signal terminals DATAi (i=0, 1, 2, 3, 4) are defined by a group name "#GRP1" in the following way:

GROUP #GRP1 ('DATA0', 'DATA1', 'DATA2', 'DATA3');

and designation can be made by using this group name so that the signal values of the four signal terminals DATAi can be represented by a binary number or a hexadecimal number. According to this designation, the signal value of the four signal terminals DATAi can be displayed by the binary number "0011", for example, or by the hexadecimal number "3".

Next, a display treatment example of the logic simulation result information by the system according to the present invention will be explained with reference to FIGS. 6 to 10.

FIG. 6 shows a display example in which windows a and b of two free-format display formats and a window c of one stream display format are displayed on the screen of the display 3.

In this drawing, ① represents the characters which the user can freely set, and ② represents the state value of the signal terminal set by the user. As already described, this state value can be designated by one character per signal terminal or by one character per four signal terminals as a group (that is, hexadecimal notation). ③ represents the simulation time, ④ is the signal terminal name and ⑤ displays the state value corresponding to the signal terminal 4 along the simulation time. ⑥ represents the present simulation time.

Figure 7:
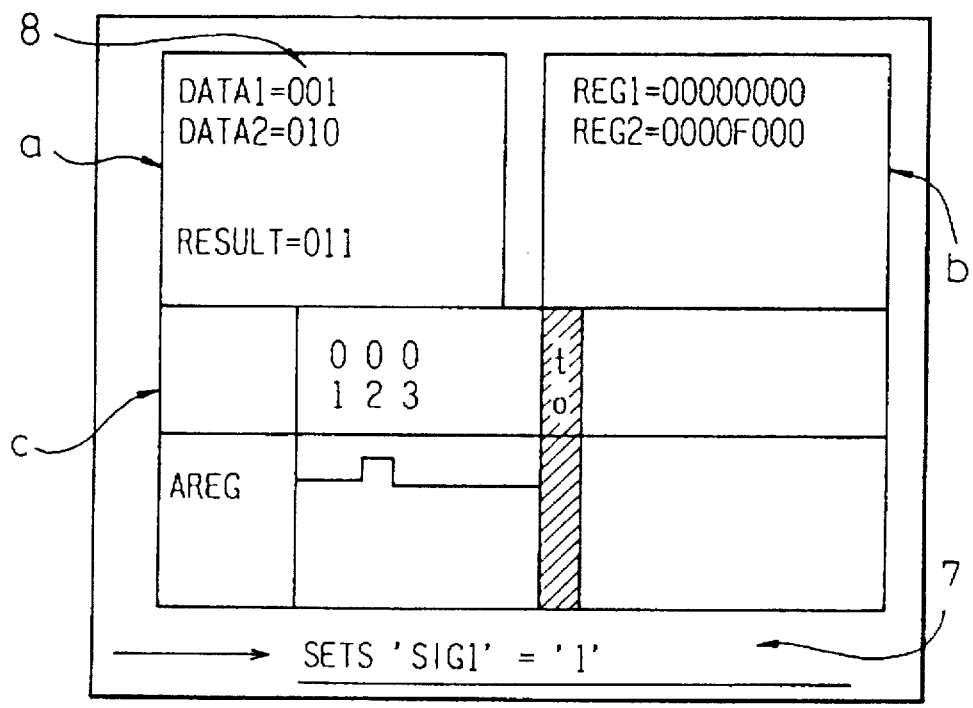
FIG. 7 is a table showing the second example of the display processing of logic simulation result information in the system shown in FIG. 1.

FIG. 7 shows a display example wherein the three windows a, b, c described above and the command input area are displayed.

In the drawing, the portion represented by ⑦ denotes the command input area for displaying the command (character string) inputted on the basis of an input operation by the user. In the case of the example shown, SETS (command for setting the value to the signal terminal) is displayed in the command area ⑦ so that "1" can be set to the signal terminal "SIGI".

Figure 8:
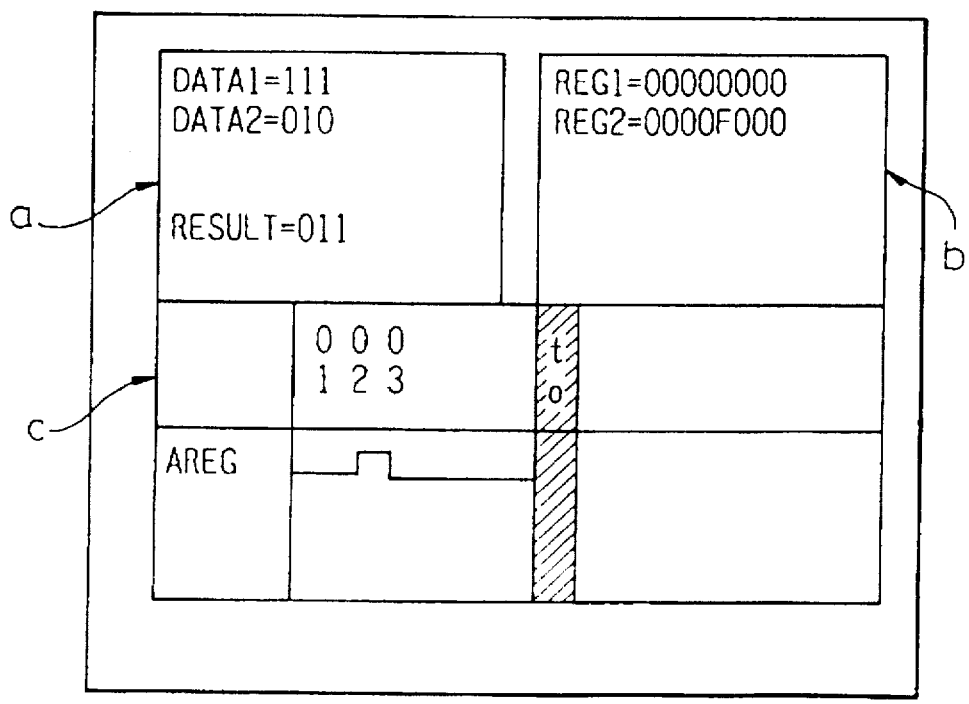
FIG. 8 is a table showing the third example of the display processing of logic simulation result information in the system shown in FIG. 1.

FIG. 8 shows a display example wherein the state value of the portion ⑧ inside the window a in the display example 7 is directly rewritten by designating this portion by a pointing device, or the like. This represents the example where the function is the same as STES (command for setting the value to the signal terminal) described above but the signal value can be easily set without inputting the long character string to the command input area ⑦ as in the case of FIG. 7.

Figure 9:
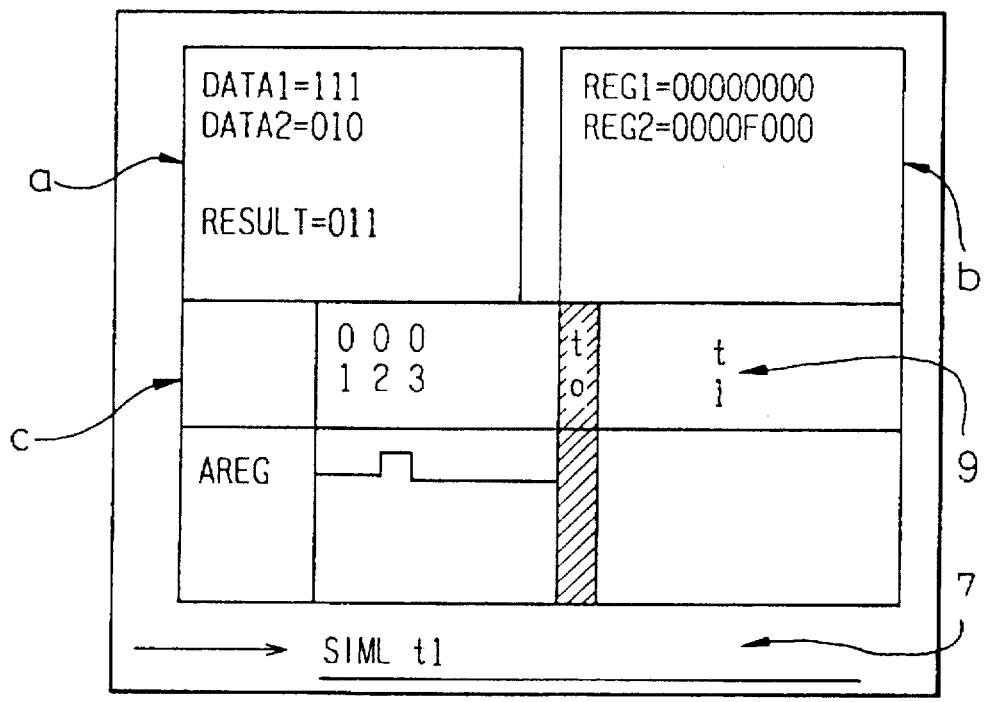
FIG. 9 is a table showing the fourth example of the display processing of logic simulation result information in the system shown in FIG. 1.

FIG. 9 shows a display example wherein SIML (command for executing simulation) is displayed in the command input area ⑦. In the example shown in the drawing, the instruction to increase the simulation time to t1 is displayed.

Figure 10:
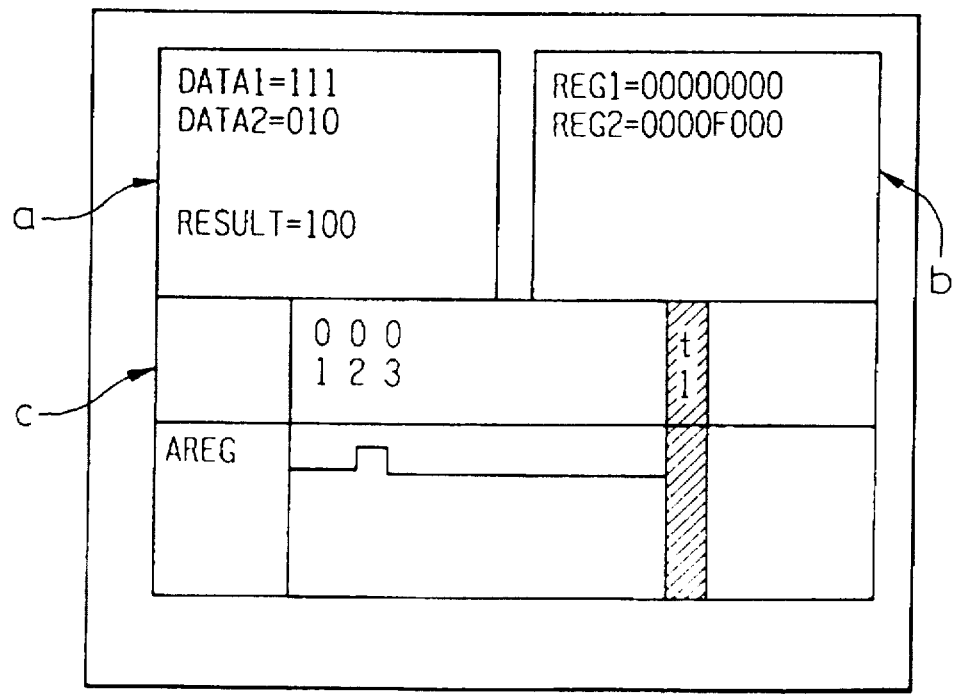
FIG. 10 is a table showing the fifth example of the display processing of logic simulation result information in the system shown in FIG. 1.

FIG. 10 shows a display example wherein the simulation time is advanced to t1 by designating the portion ⑨ inside the window c in the display example shown in FIG. 9 by the pointing device, or the like. This represents the example wherein the function is the same as that of SIML (command for executing simulation) described above but execution of simulation can be easily made without inputting the character string to the command input area ⑦ as in FIG. 9.

FIG. 11 shows an example of the content display of the memory virtual space image explained in association with FIGS. 3a, 3b and 4.

In the example shown in the drawing, the content of a virtual space image having a word length of 16K and a bit length of 72 bits is displayed. In the drawing, *1, *2, . . . , *16 represent message display columns or data input columns. In other words, *1 represents the memory name display column, *2 represents the word length display column, *3 represents the bit length display column, *4 represents the number-of-ways display column of interleave, *5 represents the base address display/input column, *6 represents the display start address displacement display/input column, *7 represents the mode (HEX/DEC) display/input column of the address expression, *8 represents a longitudinal scroll amount display/input column, *9 is a transverse scroll amount display/input column, *10 represents a start display column position display/input column, *11 represents a template name input column, *12 represents a comment display/input column, *13 represents a format display column, *14 represents an address display column, *15 represents the data display/input column and *16 represents the command input column.

Figure 12:
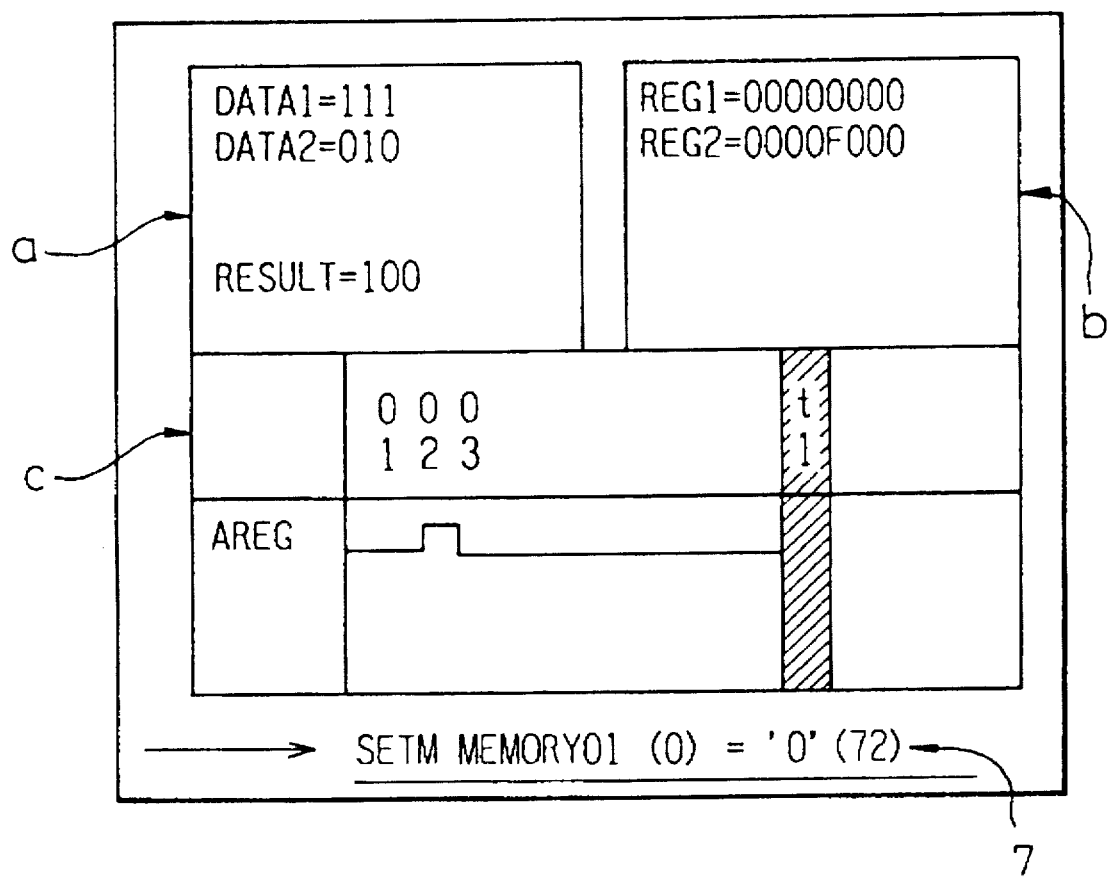
FIG. 12 is a table showing an example of content re-write of a memory.

FIG. 12 shows an example of content rewrite to the memory.

In the example shown in the drawing, SETM (command for rewriting the memory content) is displayed in the command input area ⑦ of the display screen, so that "0" is written to the 0th word of the memory space defined as MEMORY01.

FIG. 13 shows another example of rewrite to the memory content.

In the example shown in the drawing, a display example wherein rewriting is done by directly designating the data corresponding to the address "0" of the address display column *14 in the display example shown in FIG. 11 is illustrated. In this example, rewriting is done by designating only one portion but simultaneous writing can also be done by designating a plurality of portions. Though this function is the same as that of SETM (command for rewriting the memory content) described above, the example can easily rewrite the memory content without inputting the character string to the command input area ⑦ as in FIG. 12.

Figure 14:
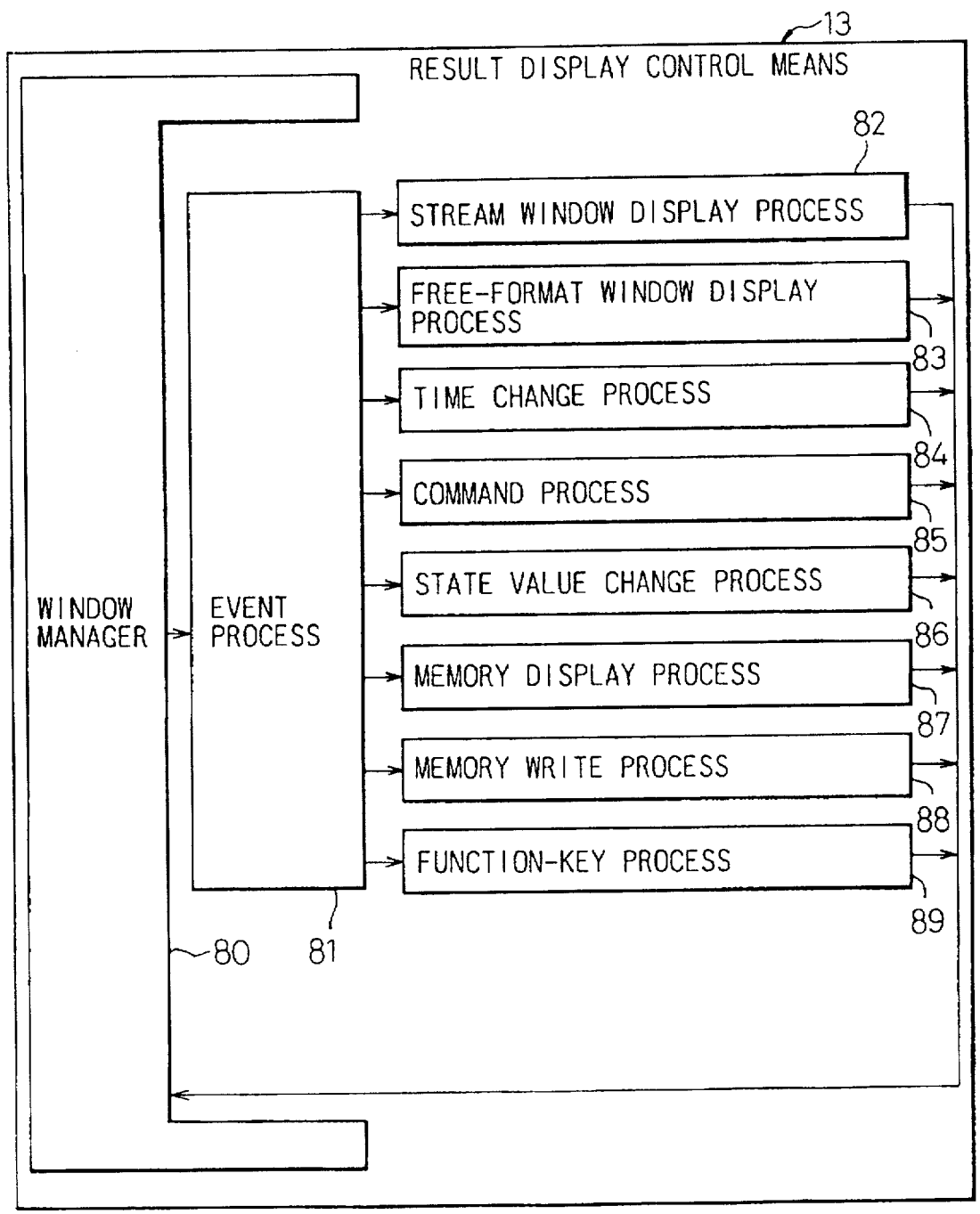
FIG. 14 is a block diagram showing an example of a program construction of result display control means shown in FIG. 1.

FIG. 14 shows an example of the program configuration of the result display control means 13.

As shown in the drawing, the result display control means 13 includes a window manager 80, an event process 81 controlled by the window manager, a stream window display process 82, a free-format window display process 83, a time change process 84, a command process 85, a state value change process 86, a memory display process 87, a memory write process 88 and a function key process 89, each of which is activated by the event process 81.

FIGS. 15 to 24 are flowcharts defining each process sent to the result display control means 13. Hereinafter, the logic simulation treatment according to this embodiment will be explained in detail with reference to these flowcharts.

Figure 15:
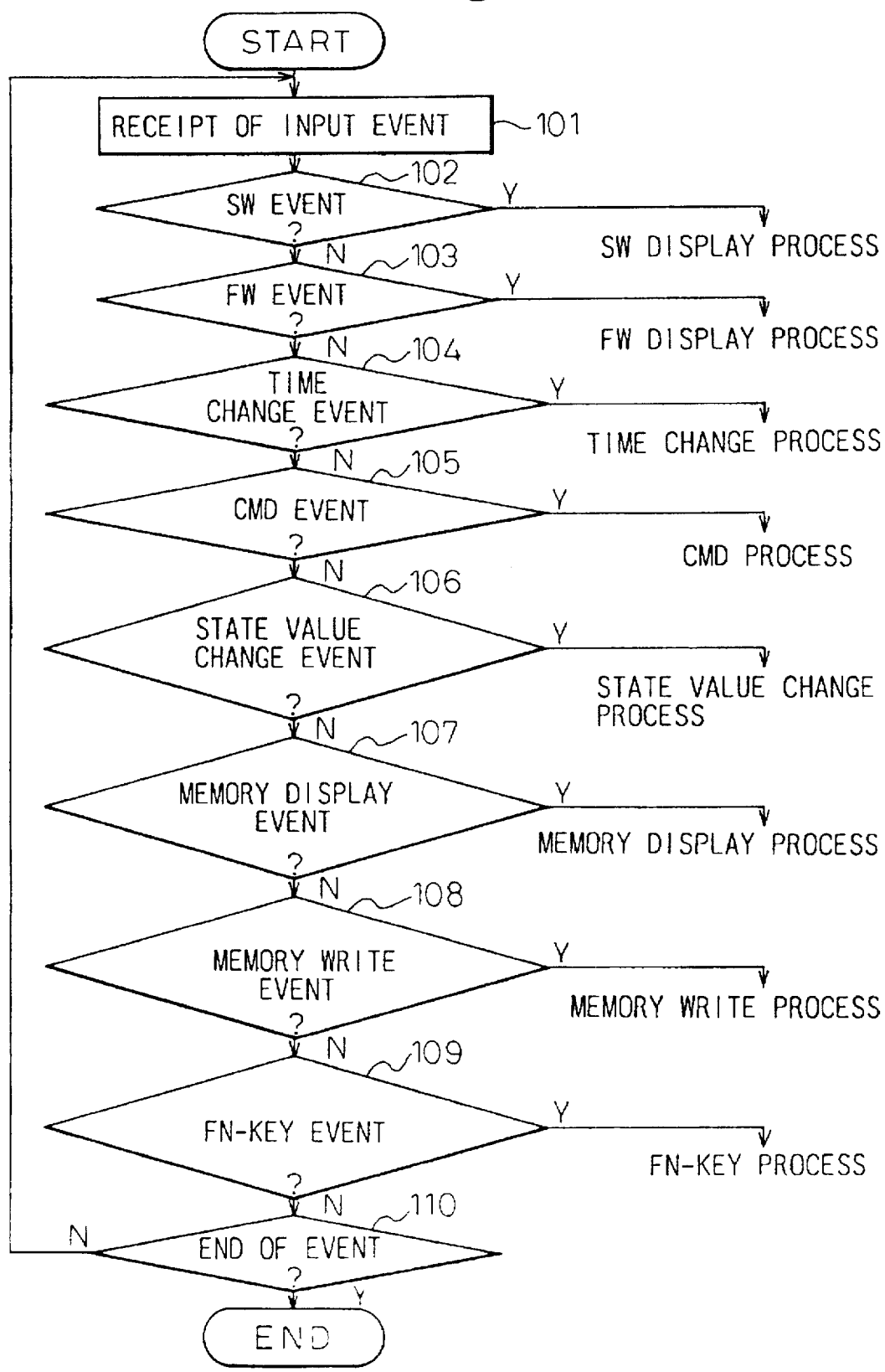
FIG. 15 is a flowchart showing an example of an event treatment process shown in FIG. 14.

<Event Process 81 . . . FIG. 15>

When an event is inputted from the terminal 2, receipt of this input event is first executed at the step 101. At the next step 102, whether or not (Y or N) the input event is an event which instructs the activation of the stream window (SW) display process 82 is judged, and when the result of judgement represents Y, the stream window display process 82 is activated and when the result represents N, the flow proceeds to the step 103. At this step 103, whether or not (Y or N) the input event is the event which instructs the activation of the free-format window (FW) display process 83 is judged, and when the result of judgment is Y, the free-format window display process 83 is activated and when the result of judgement is N, the flow proceeds to the step 104.

At the step 104, whether or not (Y or N) the input event is the event which instructs the activation of the time change process 84 is judged, and when the result of judgement represents Y, the time change process 84 is activated and when the result of judgement represent N, the flow proceeds to step 105. At step 105, whether or not (Y or N) the input event is an event which instructs the activation of the command process 85 is judged, and when the result of judgement is Y, the command process 85 is activated and when the result of judgement is N, the flow proceeds to step 106. At step 106, whether or not (Y or N) the input event is the event which instructs the activation of the state value change process 86 is judged, and when the result of judgement is Y, the state value change process 86 is activated and when the result of judgement is N, the flow proceeds to the step 107.

At step 107, whether or not (Y or N) the input event is the event which activates the memory display process 87 is determined and when the result of judgement is Y, the memory display process 87 is activated. When the result of judgement is N, the flow proceeds to the step 108. At step 108, whether or not (Y or N) the input event is the event which activates the memory write process 88 is judged, and when the result of judgement is Y, the memory write process 88 is activated and when the result of judgement is N, the flow proceeds to the step 109.

At step 109, whether or not (Y or N) the input event is the event which activates the function key process 89 is judged, and when the result of judgement represents Y, the function key process 89 is activated and when the result of judgement represents N, the flow proceeds to step 110. At step 110, whether or not (Y or N) the input event is the end event which ends the process is judged, and when the result of judgement is Y, this flow is ended and when the result of judgement is N, the flow returns to step 101, so that the process described above is repeated.

As described above, the event treatment process 81 executes the flow shown in FIG. 15 and activates the processes indicated by the input event.

Figure 16:
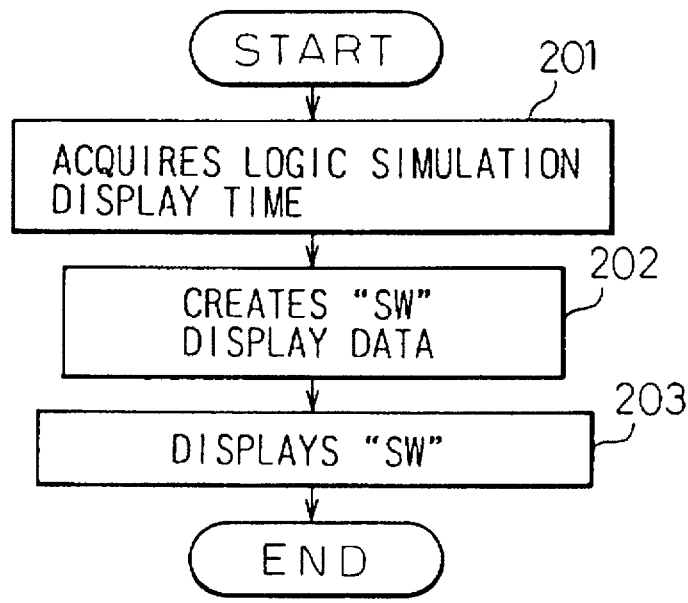
FIG. 16 is a flowchart showing an example of a stream window display process shown in FIG. 14.

<Stream Window Display Process 82 . . . FIG. 16>

When this process is activated from the event process 81, the logic simulation display time representing the present display time is first read out from the time management table 20 at step 201. At the next step, 202, the stream window display data is created by using the logic simulation display time so read out as the reference time. In other words, the signal value time series data of the signal value management table 17 in the proximity of the logic simulation display time read out is applied to the display format of the stream window designated by the stream window management table 19, so as to thereby create the stream window display data.

At the next step, 203, the stream window display data so created is displayed in the stream window (for example, window c of the stream display format shown in FIGS. 6 to 10) set by the window setting means 24. At this time, the stream window display process 82 displays, in different colors, the present simulation display time portion (portion ⑥ in FIG. 6) and the signal value portion (portion ⑤ in FIG. 6) corresponding to this simulation display time.

Figure 17:
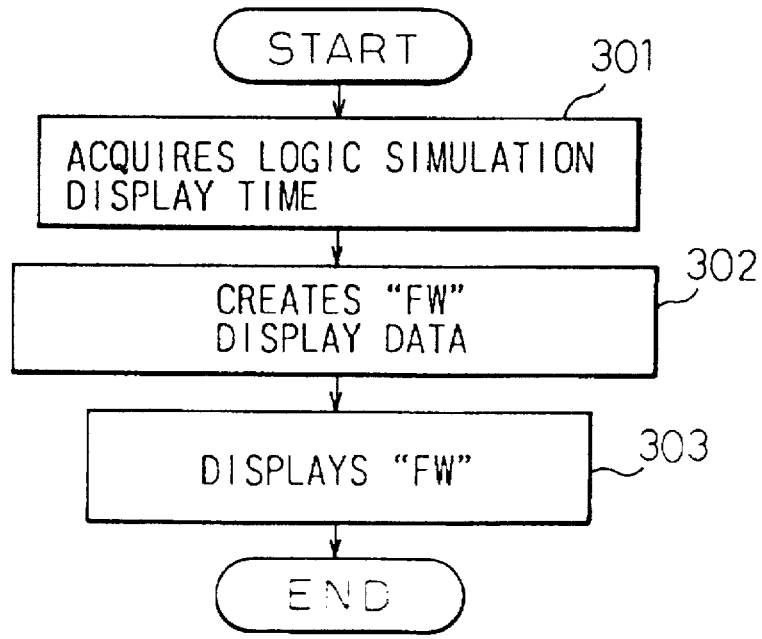
FIG. 17 is a flowchart showing an example of a free-format window display process shown in FIG. 14.

<Free-Format Window Display Process 83 . . . FIG. 17>

When this process is activated from the event process 81, the logic simulation display time representing the present display time is first read out from the time management table 20 at step 301. At the next step, 302, the free-format window display data is created by using the logic simulation display time so read out as the reference time. In other words, the free-format window display data is created by applying the signal value data of the signal value table 17 of the logic simulation display time so read out to the display format of the free-format window designated by the free-format window management table 18.

At the next step, 303, the free-format window display data so created is displayed in the free-format window (for example, windows a and b of the free-format display format shown in FIGS. 6 to 10) set by the window setting means 24.

As described above, the logic simulation result information according to the stream display format and the logic simulation result information according to the free-format display format are simultaneously displayed on the display 3 of the terminal 2 in accordance with the stream window display process 82 and with the free-format window display process 83.

Figure 18:
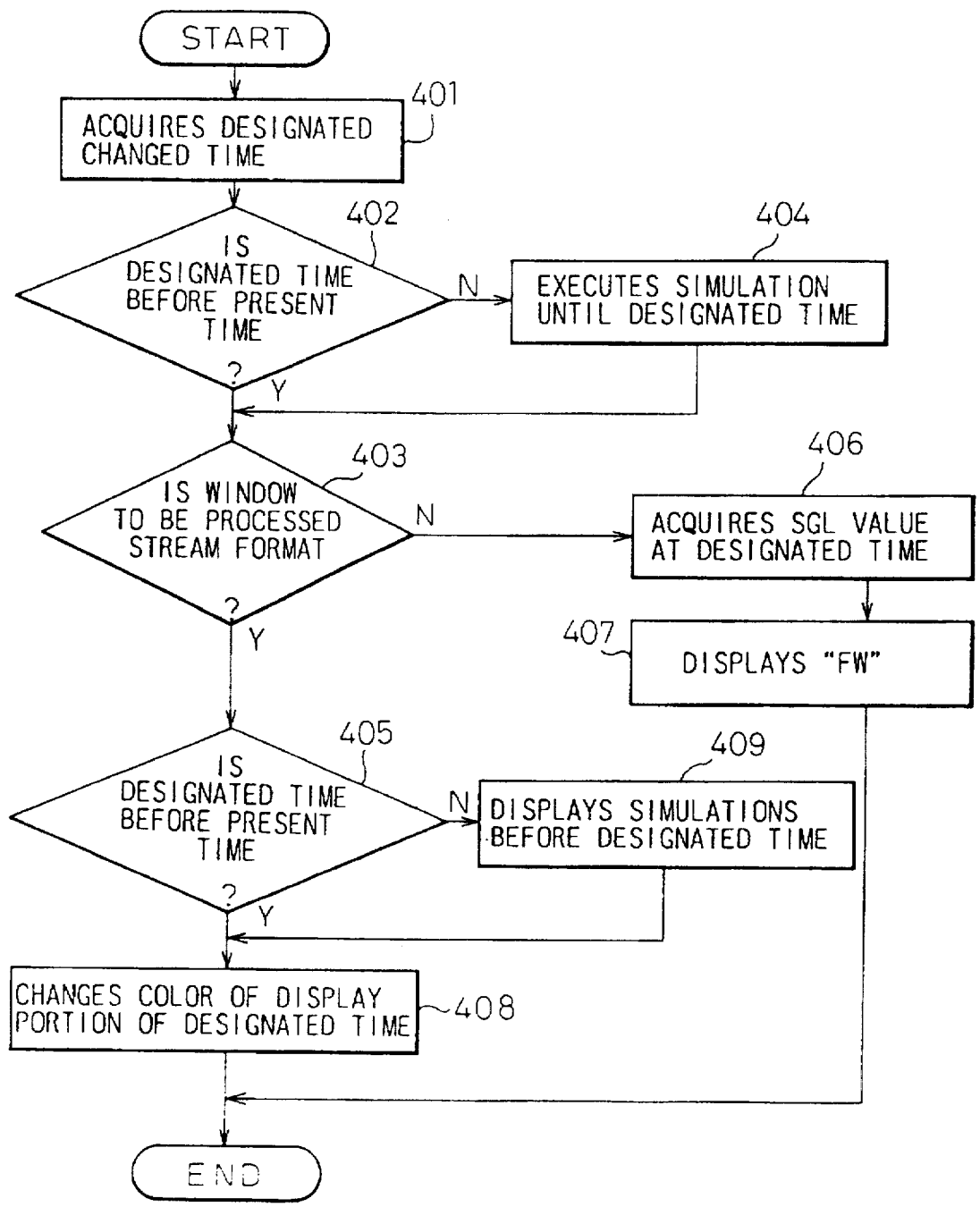
FIG. 18 is a flowchart showing an example of a time change process shown in FIG. 14.

<Time Change Process 84 . . . FIG. 18>

When this process is activated from the event process 81, the time after the designated change, which becomes the new logic simulation display time, is first acquired at the step 401. At the next step 402, whether or not (Y or N) the designated time is before the present time is judged, and when the result of judgement is Y, the flow proceeds to the step 403 and when the result of judgement is N, the flow proceeds to the step 404. At this step 404, the process for advancing the logic simulation to the designated time is executed, and the flow thereafter proceeds to step 403.

At step 403, the logic simulation display time of the time management table 20 is updated and at the same time, whether or not (Y or N) the window to be processed (that is, the window during display) is in the stream display format is judged. When the result of judgement represents Y, the flow proceeds to step 405 and when the result of judgement represents N (that is, when the window to be treated is the free-format display format), the flow proceeds to step 406. At this step, 406, the signal value of the new logic simulation display time designated is acquired from the signal value management table 17 and at the next step, 407, the signal value so acquired is compared with the signal value which is now being displayed at present, and only the different portion is displayed by changing colors on the free-format window. Thereafter, this flow reaches an end.

On the other hand, whether or not (Y or N) the designated time is ahead of the present time is judged at step 405, and when the result of judgement is Y, the flow proceeds to step 408 and when the result of judgement represents N, the flow proceeds to step 409. At step 409, the signal value from the logic simulation display time before updating till the designated new logic simulation display time is read out from the signal value management table 17 is displayed, and the flow then proceeds to step 408. At step 408, the display portion of the designated new logic simulation display time is displayed by changing the color. Thereafter, this flow reaches an end.

In this way, the logic simulation display time is updated to the time designated by the user in accordance with the time change process 84, the display portion of the present simulation display time in the stream window is displayed by changing the color, and the signal value portion which changes due to the updating of the logic simulation display time inside the signal value display in the free-format window is displayed by changing the color.

Figure 19A:
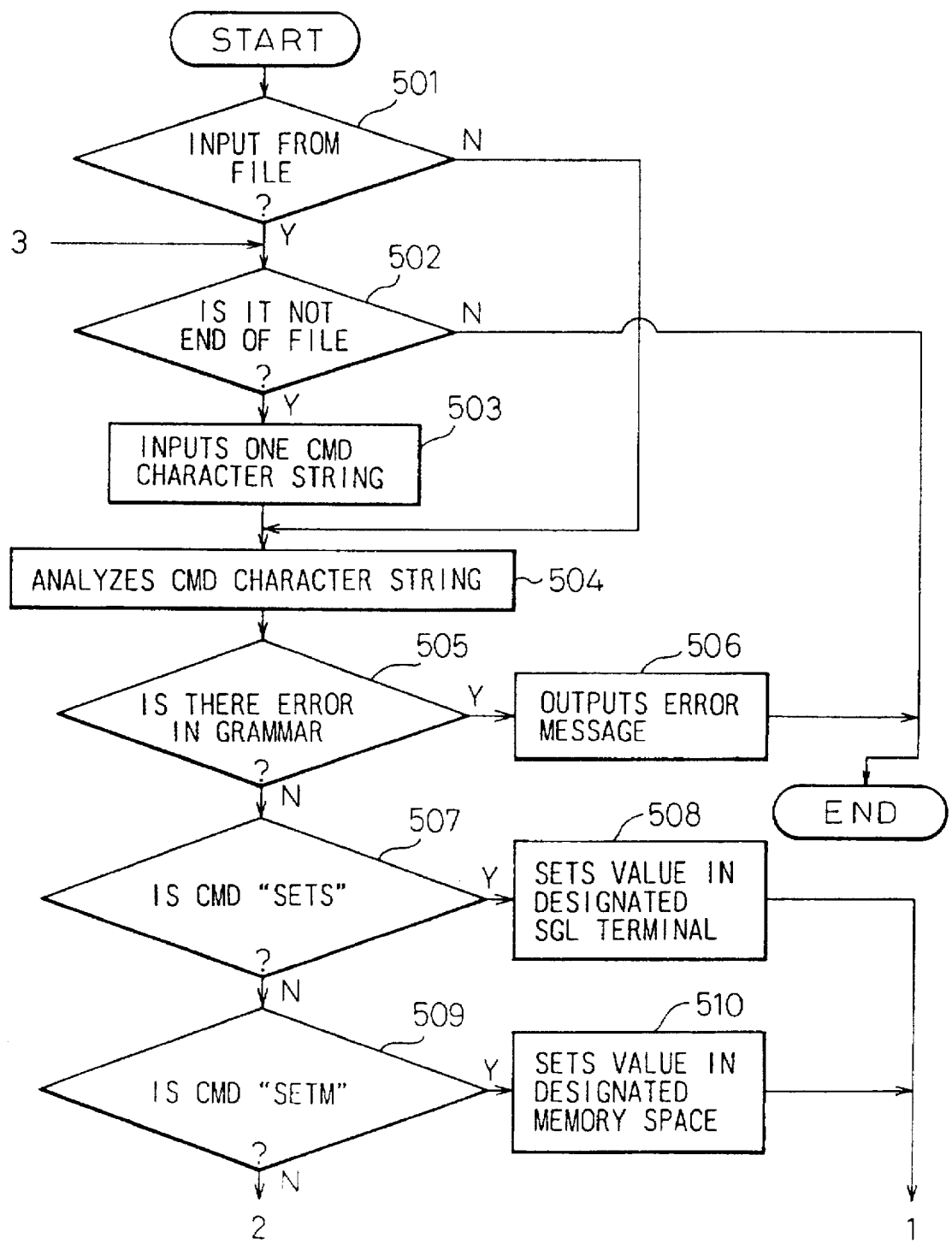
FIGS. 19a and 19b are flowcharts each showing an example of a command treatment process shown in FIG. 14.
Figure 19B:
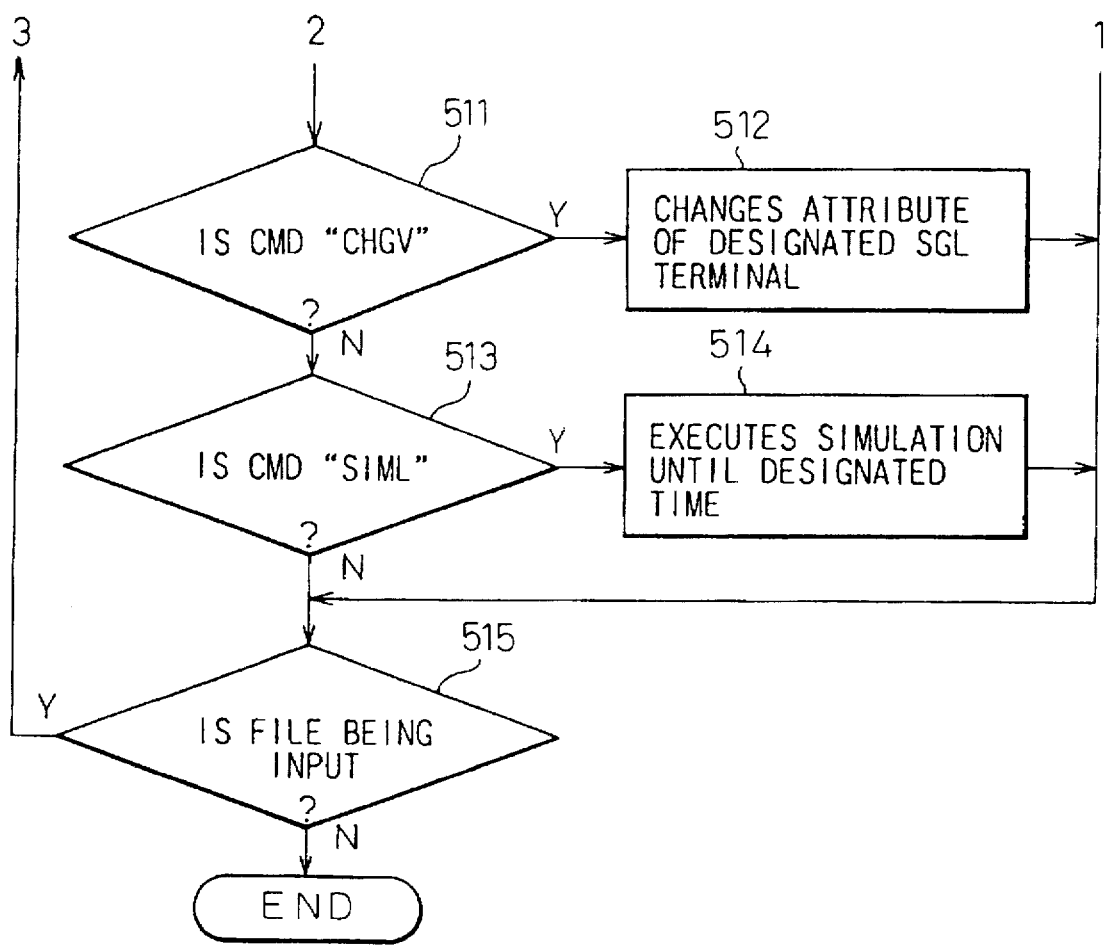

<Command Process 85 . . . FIGS. 19a, 19b>

When this process is activated by the event process 81, whether or not (Y or N) the command is inputted from the file, that is, whether or not it is input through an interaction with the user, is first judged at step 501. When the result of judgement is Y, the flow proceeds to step 502 and when the result of judgement is N, the flow proceeds to step 504. At step 502, whether or not (Y or N) the command input from the file is completed is judged, and when the result of judgement is Y, the flow proceeds to the step 503 and when the result of judgement is N, this flow reaches an end. At the step 503, one command character string is inputted from the file.

At the next step 504, analysis of the inputted command character string is executed. At the step 505, whether or not (Y or N) any grammatical error exists is judged on the basis of the result of this analysis. When the result of judgement is Y, the flow proceeds to the step 506 and when the result of judgement is N, the flow proceeds to step 507. At step 506, the error message is outputted, and this flow thereafter reaches an end.

On the other hand, at step 507, whether or not (Y or N) the inputted command is SETS (command for setting the value to the signal terminal) is judged, and when the result of the judgement is Y, the flow proceeds to the step 508 and when the result of the judgement is N, the flow proceeds to the step 509. At step 508, the value is set to the designated signal terminal, and the flow then proceeds to step 515.

On the other hand, whether or not (Y or N) the inputted command is SETM (command for rewriting the memory content) is judged at step 509, and when the result of the judgement is Y, the flow proceeds to step 510 and when the result of the judgement is N, the flow proceeds to step 511. At step 510, the value is set to the designated memory virtual space, and the flow then proceeds to step 515.

At step 511, on the other hand, whether or not (Y or N) the inputted command is CHGV (command for changing the attribute of the signal terminal) is judged, and when the result of the judgment is Y, the flow proceeds to step 512 and when the result of the judgement is N, the step proceeds to step 513. At step 512, the attribute of the designated signal terminal is changed, and the flow then proceeds to step 515.

At step 513, on the other hand, whether or not (Y or N) the input command is SIML (command for executing simulation) is judged, and when the result of the judgement is Y, the flow proceeds to step 514 and when the result of the judgement is N, the flow proceeds to step 515. At step 514, the logic simulation is executed until the designated time, and the flow then proceeds to step 515.

At step 515, whether or not (Y or N) the command is being inputted from the file is determined, and when the result of the judgement is Y, the flow returns to step 502 so as to repeat the process steps described above, and when the result of the judgement is N, this flow reaches an end.

In this way, the display data inside the window in the free-format display format, the display data inside the window in the stream display format and the content display data of the memory virtual space image data are sequentially updated by using a time satisfying conditions designated by the command, as the logic simulation display time, in accordance with the command process 85.

Figure 20:
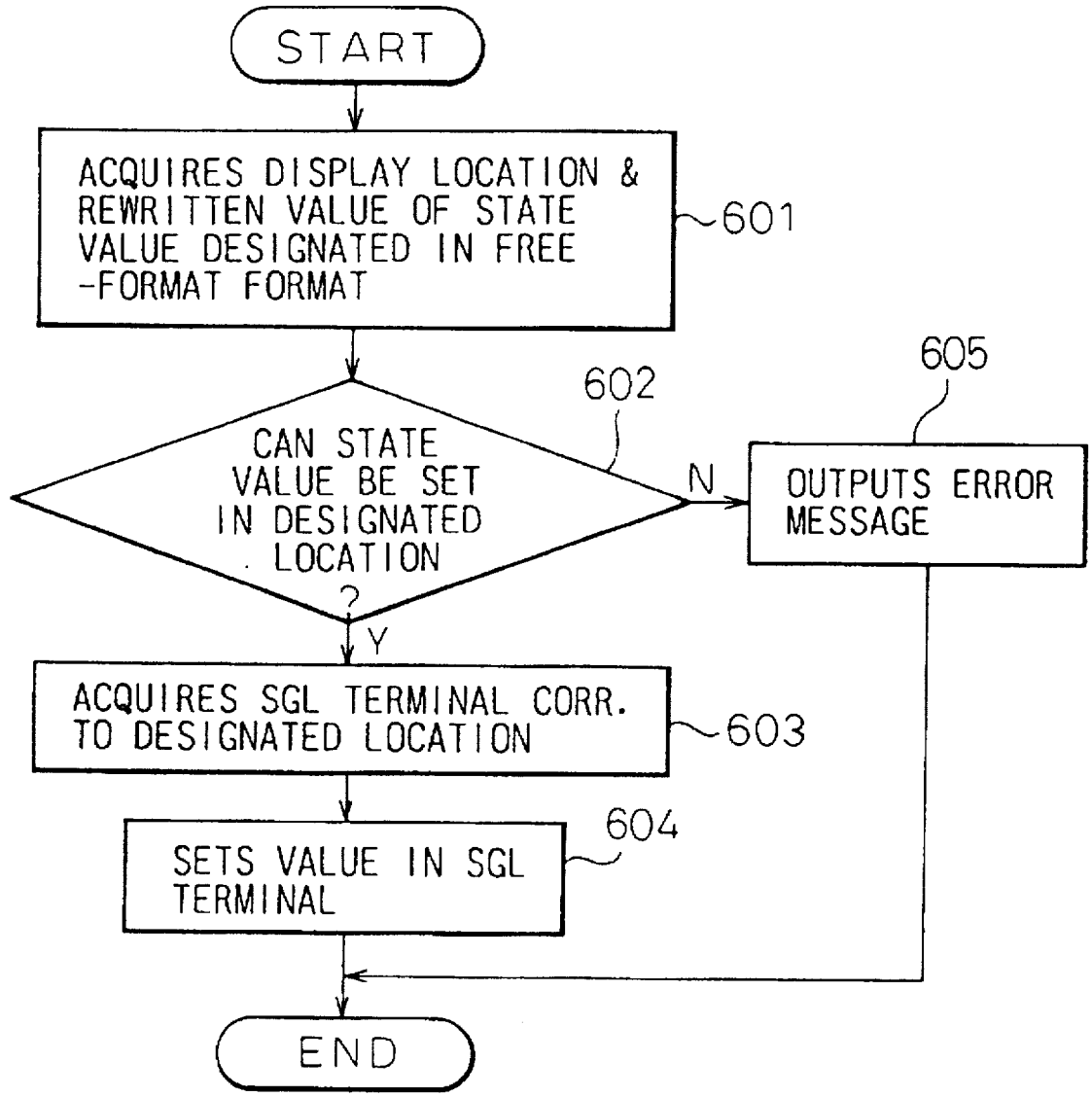
FIG. 20 is a flowchart showing an example of a state value change process shown in FIG. 14.

<State Value Change Process 86 . . . FIG. 20>

When this process is activated from the event process 81, the value rewritten to the display location of the designated state value inside the window of the free-format display port is first acquired from the window management table 16, the free-format window management table 18 and the signal value management table 17 at step 601. At step 602, whether or not (Y or N) the designated display location can set the state value described above is judged, and when the result of the judgement is Y, the flow proceeds to the step 603. When the result of the judgement is N, the flow proceeds to step 605.

At step 603, the signal terminal corresponding to the designated display location is acquired from the free-format window management table 18, and at step 604, the state value described above is set to the signal terminal so acquired. In this way, the state value at the designated display location inside the free-format window is changed and displayed. Thereafter, this flow reaches an end.

On the other hand, an error message is output at step 605, and this flow reaches an end.

As described above, the signal terminal corresponding to the display location is specified from the designation of the display location on the free-format window and the designation of the state value to be written, in accordance with the state value change process 86, and the state value of this signal terminal is changed and displayed.

Figure 21:
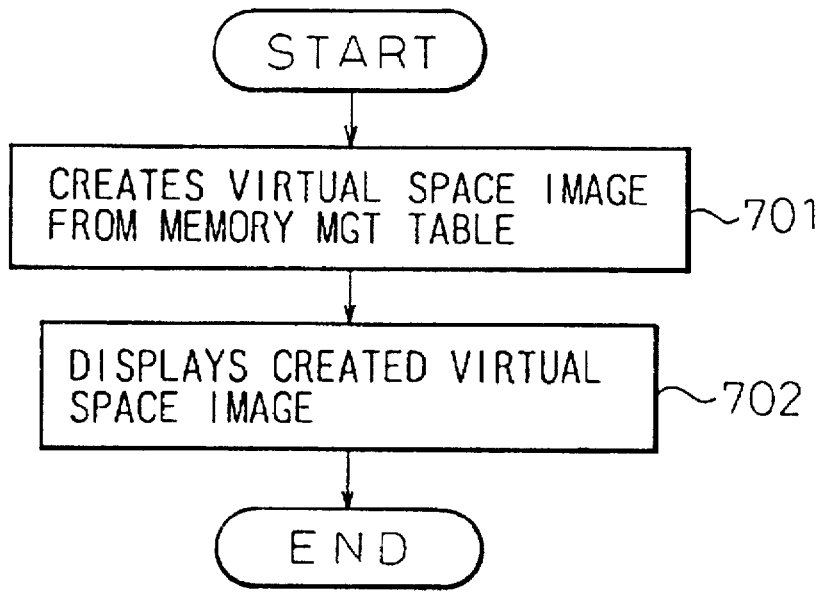
FIG. 21 is a flowchart showing an example of a memory display process shown in FIG. 14.

<Memory Display Process 87 . . . FIG. 21>

When this process is activated by the event process 81, step 701 first creates a virtual image space by looking up the memory management table 21 as explained with reference to FIGS. 3 and 4. At step 702, the virtual space image so created is displayed on the display 3 of the terminal (refer, for example, to FIGS. 11 and 13). Thereafter, this flow reaches an end.

Figure 22:
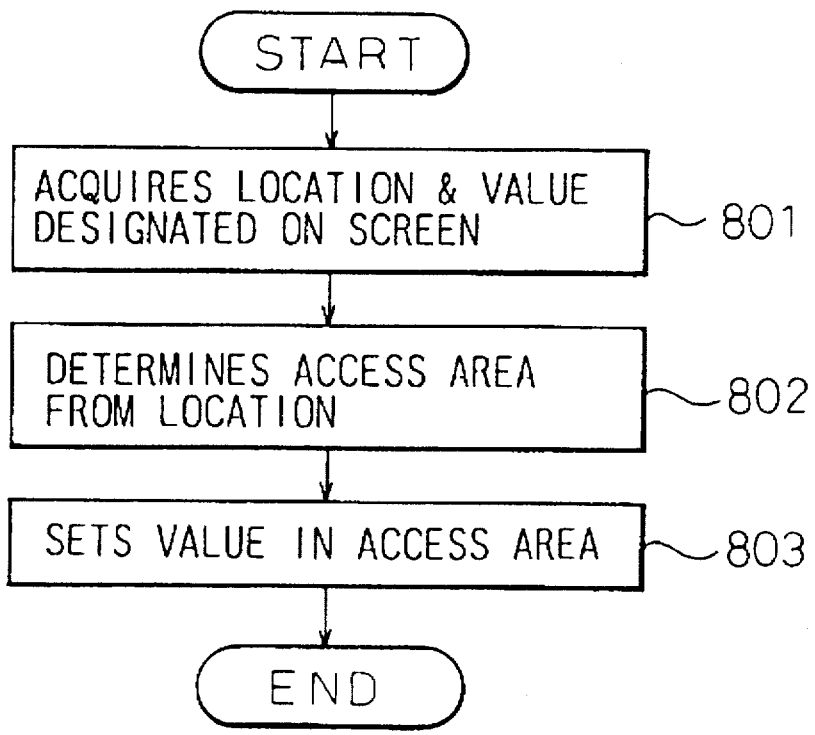
FIG. 22 is a flowchart showing the first example of a memory write process shown in FIG. 14.
Figure 23:
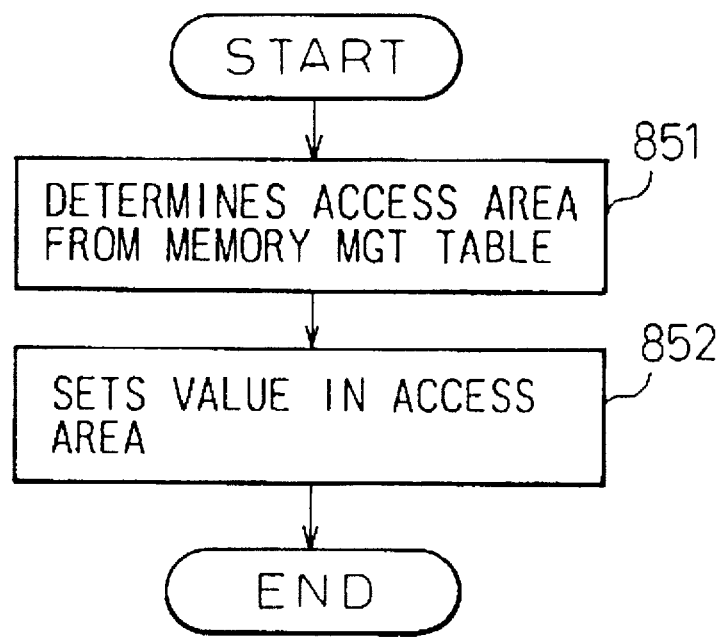
FIG. 23 is a flowchart showing the second example of the memory write process shown in FIG. 14.

<Memory Write Process 88 . . . FIGS. 22 and 23>

① First Example . . . FIG. 22

When this process is activated by the event process 81, the location directly designated on the display screen, through an interaction with the user, and the state value are first acquired at step 801. At step 802, the area to be accessed inside the memory area of the memory management table 21 (that is, the memory area designated by the address designating the location so acquired) is determined from the acquired location. At step 803, the designated state value described above is set into the area so determined. In this way, the memory content corresponding to the location directly designated on the display screen can be rewritten. Thereafter, this flow reaches an end.

② Second Example . . . FIG. 23

When this process is activated by the event process 81, an access area is determined from the memory management table 21 when the inputted command is judged as the rewrite command (SETM) of the memory content at step 851. At step 852, the state value designated by SETM is set into the area so determined. In this way, the memory content corresponding to the location designated on the display screen on the basis of SETM is rewritten. Thereafter, this flow reaches an end.

Figure 24:
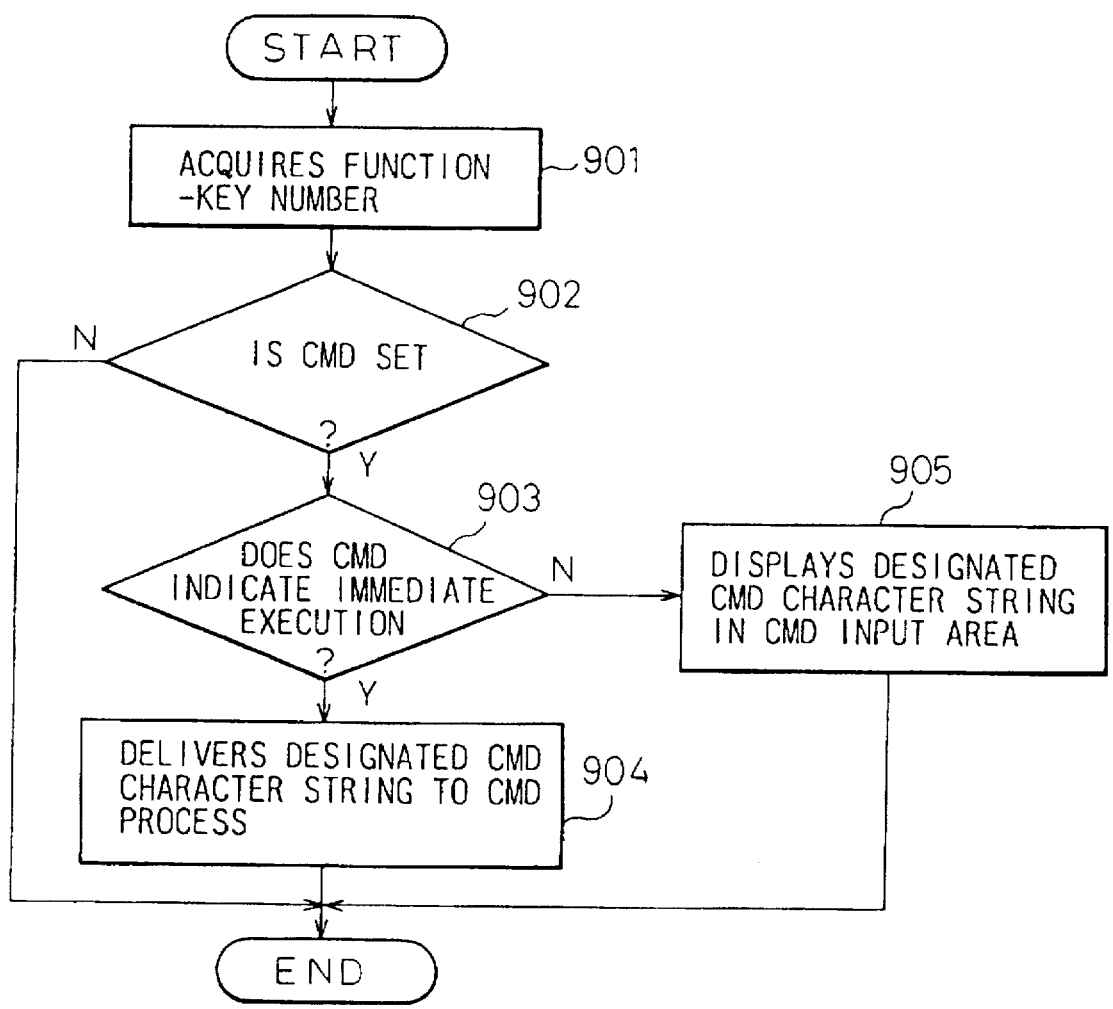
FIG. 24 is a flowchart showing an example of a function-key treatment process shown in FIG. 14.

<Function Key Process 89 . . . FIG. 24>

When this process is activated by the event process 81, the information designating the number of the function key operated by the user is first acquired from the function management table 22 at step 901. At step 902, whether or not (Y or N) a specific command is allocated to the function key operated by the user is judged, on the basis of the number information so acquired. When the result of judgement is Y, the flow proceeds to step 903 and when the result of judgement is N, this flow reaches an end.

At step 903, whether or no (Y or N) the command is a command which should be instantaneously executed is judged, and when the result of judgement is Y, the flow proceeds to step 904 and when the result of judgement is N, the flow proceeds to step 905. At step 905, the designated command character string is displayed in the command input zone (the portion ⑦ on the display screen shown in FIG. 9), and this flow thereafter reaches an end.

On the other hand, at step 904, instantaneous execution is carried out by handing the designated command character string to the afore-mentioned command process (see FIGS. 19a and 19b). Thereafter, this flow reaches an end.

As described above, in the interactive logic simulation system according to this embodiment, the result display control means 13 looks up the management data in the window management table 16 (free-format window management table 18) and in the signal value management table 17, sets the signal value of the present display time of the signal terminal of the free-format display format, and thus specifies the logic simulation result information in the free-format display format at the present display time. The result display control means 13 also looks up the management data in the window management table 16 (stream window management table 19) and in the signal value management table 17, specifies the time series data of the signal values inclusive of the present display time of the signal terminal of the stream display format, and thus specifies the logic simulation result information in the stream display format inclusive of the present display time. The logic simulation result information in the free-format display form and the logic simulation result information in the stream display format that are thus specified are simultaneously displayed inside a window on the display screen.

The command analyzing means 14 analyzes the command inputted through the input/output control means 10 through the interaction with the user by using the display 3. When the result of analysis proves to be a command for setting the signal value to the signal terminal, the command analyzing means 14 hands control over to the signal value setting means 26. The signal value setting means 26 changes the state of the signal value by reporting the change to the logic circuit data information managing means 11. When signal values are set, they may be set by decimal notation, or may be set by binary or hexadecimal notation.

The state value selecting means 25 selects the state value in the free-format display format by interacting with the user through the display screen. When the selected state value is judged as a different value from the original display value, this means 25 hands over the signal terminal corresponding to the selected state value with the inputted value to the signal value setting means 26 by looking up the window management table 16. Receiving this signal terminal, the signal value setting means 26 directly changes the state value designated in the free-format display format.

The time setting means 31 selects the simulation time in the stream display format by interacting with the user through the display screen. When the selected simulation time is judged as being ahead of the present time, the control is transferred to the simulation executing means 30 so as to continue the simulation until the selected simulation time.

On the other hand, the memory content selecting means 32 selects the contents of the memory designated by the user among the memory contents displayed on the display screen by interacting with the user through the display screen. When the value of the designated memory content is judged as being a different value from the original display value, the control is transferred to the memory content setting means 29 by looking up the memory management table 21 so as to re-write the contents of the designated memory.

As described above, according to the interactive logic simulation system of this embodiment, the logic simulation result information in the free-format display format, which enables display of the signal value of a large number of signal terminals and the logic simulation result information in the stream display format which makes it possible to trace the flow in time of the signal values of the signal terminals that are simultaneously displayed on the same display screen in the multi-window form. Further, this embodiment employs the basic construction for displaying the content of the memory virtual space image on the display screen, eliminates the necessity for input instruction by the selection of the menu, and sets the state value by direct write to the free-format display or executes the simulation by directly designating the time portion on the stream display or rewrites the memory contents, by direct write, onto the memory content display.

Accordingly, the user can easily and efficiently conduct logic simulation and its analysis without being aware of the troublesome procedures of the logic simulation and its operation.

When the simulation procedure of the next stage is considered, too, an interruption to this consideration can be reduced and the simulation can be efficiently performed.

Although the above embodiment is so constituted that the display color is changed to thereby call the user's attention to the display, the present invention is not limited thereto. For example, other constitution of changing the brightness of display, or of blinking the display, may be adopted.

What is claimed is:

1. An interactive logic simulation system employing the construction wherein logic simulation is effected by interacting with a user through a display screen and the result of said simulation is displayed on said display screen, said system comprising:

setting means for setting at least one display format of the logic simulation result information in the form of a window defined by an arbitrary display range through the interaction with the user through said display screen;

a first management table for managing the display form of a free-format display format set by said setting means;

a second management table for managing the display form of a stream display format to serve as a time series display format of the logic simulation result information;

a third management table for managing time series data of a signal value for each signal terminal for forming the logic simulation result information; and result display control means for specifying the logic simulation result information by using the management data of said first, second and third management tables, and displaying the logic simulation result information so specified on said display screen;

wherein the logic simulation result information in the free-format display format at a designated time and the logic simulation result information in the stream display format at a designated signal terminal are simultaneously displayed in a window set on said display screen.

2. The system according to claim 1, further comprising:

means for managing logic circuit data information associated with said signal terminals of said logic circuit as the object of logic simulation;

means for analyzing a command given by the user through the interaction through said display screen; and means for setting a signal value by changing the information of the signal value corresponding to said signal terminal designated among the logic circuit data information on the basis of the result of analysis when said command is a command for setting the signal value to said signal terminal.

3. The system according to claim 2, wherein said means for setting the signal value sets the signal value to said signal value on the basis of a command by the designation of one signal terminal name or a group name of a plurality of signal terminals.

4. The system according to claim 3, wherein said result display control means gathers and displays the signal values of a plurality of signal terminals in hexadecimal or binary notation.

5. The system according to claim 1, further comprising:

means for managing the logic circuit data information associated with the signal terminals of the logic circuit as the object of the logic simulation;

means for selecting the state value designated by the user among the state values displayed in the window of the free-format display format by interacting with the user through said display screen; and means for specifying the signal terminal corresponding to the selected state value by referring to said first management table and changing the state value information at the present time corresponding to said specified signal terminal among the logic circuit data information when the selected state value is different from the original display value.

6. The system according to claim 1, further comprising:

means for managing the logic circuit data information associated with the signal terminals of the logic circuit as the object of the logic simulation;

means for analyzing the command given by the user through the interaction with said display screen; and means for inhibiting the evaluation of a corresponding device or circuit in the logic simulation object circuit by changing attribute information of the signal terminal designated among the logic circuit data information on the basis of the result of analysis when the command is a command designating the attribute change.

7. The system according to claim 1, further comprising:

means for analyzing the command given by the user through the interaction with said display screen; and means for executing the logic simulation at the time specified by the command on the basis of the result of analysis when the command is a command for executing the simulation.

8. The system according to claim 1, further comprising:

means for setting an arbitrary simulation time in the window of the stream display format displayed on said display screen through the interaction with said display screen; and means for executing the logic simulation until said set simulation time.

9. The system according to claim 8, wherein said result display control means displays the logic simulation result information at a set past time in the free-format display format when said set simulation time is before the set past time.

10. The system according to claim 1, further comprising:

a function management table for managing command data allocated to function keys provided with an input device operated by the user; and means for specifying a command allocated to a function key designated by the user through the interaction with said display screen, and controlling an instantaneous execution of the defined command or the display of the command to the specific display area in said display screen in accordance with the content of the specified command.

11. The system according to claim 1, further comprising:

means for analyzing the command given by the user through interaction with said display screen; and means for outputting a command which is free from an error as a log on the basis of the result of analysis of the command.

12. The system according to claim 1, further comprising:

a memory management table for managing data defining a logic address space for specifying a plurality of memory cells in the circuit as the logic simulation object; and wherein the memory content is displayed on said display screen, by a memory virtual space image defined by the logic address space, by looking up said memory management table.

13. The system according to claim 12, further comprising:

means for analyzing a command given by the user through the interaction with said display screen; and means for displaying a corresponding memory content on said display screen by looking up said memory management table when said command designates a memory content display, on the basis of the result of the analysis.

14. The system according to claim 12, further comprising:

means for analyzing a command given by the user through the interaction with said display screen; and means for rewriting the memory content of a memory cell in a simulation object circuit when said command is a memory content set command, on the basis of the result of analysis.

15. The system according to claim 12, further comprising:

means for selecting a memory content designated by the user among the memory contents displayed on said display screen through interaction with the user through said display screen; and means for rewriting the selected memory content by looking up said memory management table when the value of the selected memory content is different from an original display value.

16. The system according to claim 12, wherein, when addresses for specifying a plurality of memory cells inside the simulation object circuit are discontinuously set in accordance with a predetermined conversion rule due to interleave, etc., the data are rearranged in accordance with said predetermined conversion rule so that they can be displayed continuously in said memory virtual space, when said memory content is displayed by said memory virtual space image corresponding to said address space on said display screen.

17. The system according to claim 16, wherein, when an arbitrary address and a bit value in said memory virtual space displayed on said display screen are rewritten, the addresses for the memory cells inside the simulation object circuit are calculated by reverse conversion of address conversion according to claim 16, and the contents of the memory cells are rewritten by rearranging the data.

* * * * *